(12) United States Patent
Barth et al.

(10) Patent No.: US 9,819,334 B1
(45) Date of Patent: Nov. 14, 2017

(54) CIRCUIT FOR GENERATING FAST RISE TIME PULSE USING COAXIAL TRANSMISSION LINES

(71) Applicants: Jon E. Barth, Boulder City, NV (US); John R. Richner, Boulder City, NV (US)

(72) Inventors: Jon E. Barth, Boulder City, NV (US); John R. Richner, Boulder City, NV (US)

(*) Notice: Subject to any disclaimer, the term of this patent is extended or adjusted under 35 U.S.C. 154(b) by 86 days.

(21) Appl. No.: 15/050,260

(22) Filed: Feb. 22, 2016

Related U.S. Application Data

(60) Provisional application No. 62/119,056, filed on Feb. 20, 2015.

(51) Int. Cl.
*H01P 3/06* (2006.01)
*H03K 5/14* (2014.01)

(52) U.S. Cl.
CPC ........ *H03K 5/14* (2013.01); *H01P 3/06* (2013.01)

(58) Field of Classification Search
CPC ........ H01B 11/125; H03H 11/26; H03K 4/00; H03K 4/02; H03K 5/14; H01P 3/06
USPC .................. 333/20, 160, 236, 243
See application file for complete search history.

(56) References Cited

U.S. PATENT DOCUMENTS

| 3,409,846 A | 11/1968 | Bray |
| 3,629,740 A | 12/1971 | Merrill |
| 5,872,490 A * | 2/1999 | Kamimura ........... H01B 11/125 174/36 |
| 6,239,671 B1 * | 5/2001 | Smith ...................... H03H 7/38 333/156 |
| 2010/0188128 A1 * | 7/2010 | Liaw ..................... H04L 25/497 327/290 |

* cited by examiner

*Primary Examiner* — Dean Takaoka
*Assistant Examiner* — Alan Wong
(74) *Attorney, Agent, or Firm* — Kenehan & Lambertsen, Ltd.; John C. Lambertsen (57) ABSTRACT

A signal generator produces an output signal in response to an input step signal using two transmission lines with characteristic impedances corresponding to the impedances of a signal source and a load. The input signal is applied to the inner conductor of the first transmission line, which has the outer shield grounded. The input signal is applied to the outer shield of the second transmission line, which has a floating outer shield. The inner conductor and the outer shield of the first transmission line are open at the second end. The inner conductor and the outer shield of the second transmission line are shorted at the second end. This transmission line is bridged by two resistors, the junction of which is connected to the inner conductor of the transmission line. The output signal has a first step at half the input voltage and a second step at the input voltage.

7 Claims, 9 Drawing Sheets

CIRCUIT FOR GENERATING FAST RISE TIME PULSE USING COAXIAL TRANSMISSION LINES

FIELD OF THE INVENTION

The present invention is in the field of forming equal amplitude and linear voltage waveforms with coaxial transmission line for fast rise time pulses.

BACKGROUND OF THE INVENTION

Measuring the accuracy of high speed digitizers which operate in the subnanosecond time domain requires known time steps with known amplitude voltage waveform with rapid transitions. High speed transistors are used in balanced circuits for differential measurements which must be identified as to their common mode rejection of rapidly rising signals with accurately known rates of rise. Other circuits require linear rising waveforms of kilovolt amplitudes to produce high currents used to compress gaseous plasma discharges in fusion generation experiments.

The technology to produce these waveforms has been impractical because of excessive losses or limitations in the accuracy of the formation of the waveforms and limitations in the amplitudes of the waveforms.

A two-step waveform circuit in U.S. Pat. No. 3,629,740 to Merrill produces two equal amplitude steps but requires both 50-ohm and 100-ohm coaxial cable and requires a 50-ohm resistor. The supply of 100-ohm coaxial cable is limited and the impedance of 100-ohm coaxial cable is not necessarily exactly twice that of more readily available 50-ohm coaxial cable. The equality of the two steps produced by the Merrill circuit depends on the 100-ohm coaxial cable being equal to exactly twice that of the 50-ohm coaxial cable also used in the two-step waveform generating circuit. Skin effect losses in coaxial cable degrade the rise time of pulses traveling through the cable with the inner conductor, which has much less surface area for current flow than the outer conductor, causing most of the loss. The center conductor of 100-ohm coaxial cable has a diameter that ranges from approximately $\frac{1}{3}$ to approximately $\frac{1}{4}$ the diameter of 50-ohm coaxial transmission line depending on the dielectric constant of the insulator supporting the center conductor. The two-step waveform in the Merrill circuit must travel through one 100-ohm transmission line with another 100-ohm stub transmission line used as a pulse forming element and with a 50-ohm stub transmission line element. The two stub transmission lines with different impedances have different high speed losses. The series 100-ohm transmission line also has different high speed losses. The different, high magnitude skin effect losses degrade the rise times of the two equal amplitude steps.

SUMMARY OF THE INVENTION

A need exists for waveforms having multiple equal amplitude electrical steps and for waveforms having linear electrical ramps having sub-nanosecond rise times to multiple nanosecond rise times. The waveform generation circuit disclosed herein uses 50-ohm coaxial transmission lines and 50-ohm resistors to produce the desired waveforms. The circuit includes one or more subcircuits, which may be connected in series. When a step function is applied to the circuit, the circuit generates a waveform having $2^n$ equal amplitude electrical steps where n is the number of subcircuits connected in series. Each subcircuit uses 50-ohm coaxial transmission lines to generate the electrical steps. Each subsequent subcircuit uses coaxial transmission lines having half the length of the transmission lines in the previous subcircuit to generate twice the number of steps of the previous subcircuit. Additional subcircuits can be added to increase the number of steps generated by the circuit, each subsequent subcircuit having steps of decreasing time duration with respect to the steps of the previous subcircuit. Sufficient subcircuits can be added such that each multiple step output waveform from the circuit is shorter than the rise time of the input step function to cause the output waveform to be a linear ramp waveform.

One aspect of embodiments in accordance with embodiments disclosed herein is a signal generator that produces an output signal in response to an input step signal using two transmission lines with characteristic impedances corresponding to the impedances of a signal source and a load. The input signal is applied to the inner conductor of the first transmission line, which has the outer shield grounded. The input signal is applied to the outer shield of the second transmission line, which has a floating outer shield. The inner conductor and the outer shield of the first transmission line are open at the second end. The inner conductor and the outer shield of the second transmission line are shorted at the second end. The two transmission lines initially generate an output voltage having a magnitude of approximately one-half the magnitude of the input step. After a time delay determined by the length of each transmission line, the output voltage increases to the input voltage.

Another aspect of embodiments disclosed herein is an apparatus for generating a multi-step output signal from a single-step input signal. The apparatus includes a first transmission line. The first transmission line has a first selected length between a respective first end and a respective second end. The first selected length provides a first propagation delay from the first end to the second end and back to the first end. The first transmission line has a respective inner conductor and a respective outer shield, and has a first predetermined characteristic impedance. The inner conductor and the outer shield form an open circuit at the second end of the first transmission line. The outer shield of the first transmission line is connected to a voltage reference near the first end of the first transmission line. The apparatus further includes a second transmission line having a second selected length between a respective first end and a respective second end. The second selected length provides a second propagation delay from the first end to the second end and back to the first end. The second selected length is selected such that the second propagation delay is substantially equal to the first propagation delay. The second transmission line has a respective inner conductor and a respective outer shield, and has a second predetermined characteristic impedance. The second characteristic impedance is substantially equal to the first characteristic impedance. The inner conductor and the outer shield are interconnected at the second end of the first transmission line to form a short circuit. An input terminal of the apparatus receives an input signal. The input terminal is electrically connected to the outer shield of the second transmission line at the first end of the second transmission line. The apparatus includes a first resistor having a first terminal electrically connected to the input terminal and having a second terminal electrically connected to the inner conductor of the first transmission line at the first end of the first transmission line. The first resistor has a resistance value substantially equal to the characteristic impedance of the first transmission line. An output terminal is electrically connected to the inner conductor of the second transmission line at the first end of the second transmission line. The output terminal provides a multi-step output signal in response to the single-step input signal. A second resistor has a first terminal electrically connected to the inner conductor of the first transmission line and has a second terminal electrically connected to the output terminal. The second resistor has a resistance value substantially equal to the characteristic impedance of the first transmission line. In certain embodiments, the apparatus further includes a ferrite toroid positioned on the outer shield of the second transmission line near the first end of the second transmission line.

Another aspect of embodiments disclosed herein is an apparatus for generating a multi-step output signal from a single-step input signal. The apparatus includes an input terminal, which is connectable to receive an input signal from a source having a characteristic impedance. An output terminal is connectable to a load having the characteristic impedance. A first transmission line and a second transmission line each have the characteristic impedance between a respective inner conductor and a respective outer shield. Each transmission line has a respective length between a respective first end and a respective second end. The lengths of the two transmission lines are substantially equal to provide a propagation delay from the respective first end to the respective second end and back to the respective first end. The outer shield of the first transmission line is electrically connected to a voltage reference near the first end of the first transmission line. The inner conductor and the outer shield of the first transmission line are open-circuited at the second end of the first transmission line. The inner conductor and the outer shield of the second transmission line are electrically connected (short circuited) near the second end of the second transmission line. The outer shield of the second transmission line is connected to the input terminal. A first resistor and a second resistor have a resistance selected to correspond to the characteristic impedance of the transmission lines. The first resistor is connected between the input terminal and the first end of the inner conductor of the first transmission line. The second resistor is connected between the first end of the inner conductor of the first transmission line and the output terminal. In certain embodiments, the apparatus further includes a ferrite toroid positioned on the outer shield of the second transmission line near the first end of the second transmission line.

Another aspect of embodiments disclosed herein is a method for generating a multi-step output signal from a single-step input signal. The method includes coupling an input signal from an input terminal to a first terminal of a first resistor having a resistance value. The method couples the signal from a second terminal of the first resistor to the first end of the inner conductor of a first transmission line, which has a characteristic impedance corresponding to the resistance value. The first transmission line has a selected length between a first end and a second end to provide a propagation delay from the first end to the second end and back to the first end. The first transmission line has a respective outer shield. The first end of the outer shield is electrically connected to a voltage reference. The inner conductor and the outer shield of the first transmission line form an open circuit at the second end of the first transmission line. The method further includes coupling the input signal from the input terminal to the first end of the outer shield of a second transmission line having the characteristic impedance. The second transmission line has the selected length to provide the propagation delay. The outer shield and the inner conductor of the second transmission line are short-circuited at the second end of the second transmission line. The method further includes coupling the inner conductor of the second transmission line to an output terminal. In accordance with the method, the first transmission line is responsive to an input step voltage of the input signal to propagate a first pulse having a first polarity at a magnitude of approximately one-half the input step voltage from the first end of the first transmission line to the second end of the first transmission line. The first pulse is reflected at the open circuited second end of the first transmission line to return to the first end of first transmission line at the magnitude and at the first polarity to produce a voltage approximately equal to the input step voltage at the first end of the inner conductor after the propagation delay. The second transmission line is responsive to the input step voltage of the input signal to propagate a second pulse having the first polarity and approximately one-half the input step voltage from the first end of the second transmission line to the second end of the second transmission line. The second pulse is reflected at the short circuited second end of the second transmission line to return to the first end of second transmission line at a second polarity and at the first magnitude to produce a voltage approximately equal to zero between the inner conductor and the outer shield of the second transmission line after the propagation delay to thereby cause the magnitude of the input step voltage to be applied to the output terminal after the propagation delay. The second transmission line causes the output terminal to have an output voltage that changes to one-half the input voltage when the input voltage first changes and to have an output voltage approximately equal to the input voltage after the propagation delay. In certain embodiments, the method further includes positioning a ferrite toroid on the outer shield of the second transmission line near the first end of the second transmission line to suppress high frequency currents on the outer shield of the second transmission line.

The foregoing method can be practiced with multiple stages wherein the input terminal, the output terminal, the first resistor, the first transmission line and the second transmission line comprise a first circuit. The method further includes coupling the output terminal of the first circuit to the input terminal of a second circuit. The second circuit is substantially identical to the first circuit but with transmission lines of the second circuit having approximately one-half the propagation delay of the first circuit. The second circuit produces an output signal having two steps for each change of the output voltage of the first circuit to thereby produce four steps for each change of the input signal to the first circuit.

BRIEF DESCRIPTIONS OF THE DRAWINGS

The foregoing aspects and other aspects of the disclosure are described in detail below in connection with the accompanying drawings in which.

DESCRIPTION OF ILLUSTRATED EMBODIMENTS

Figure 1:
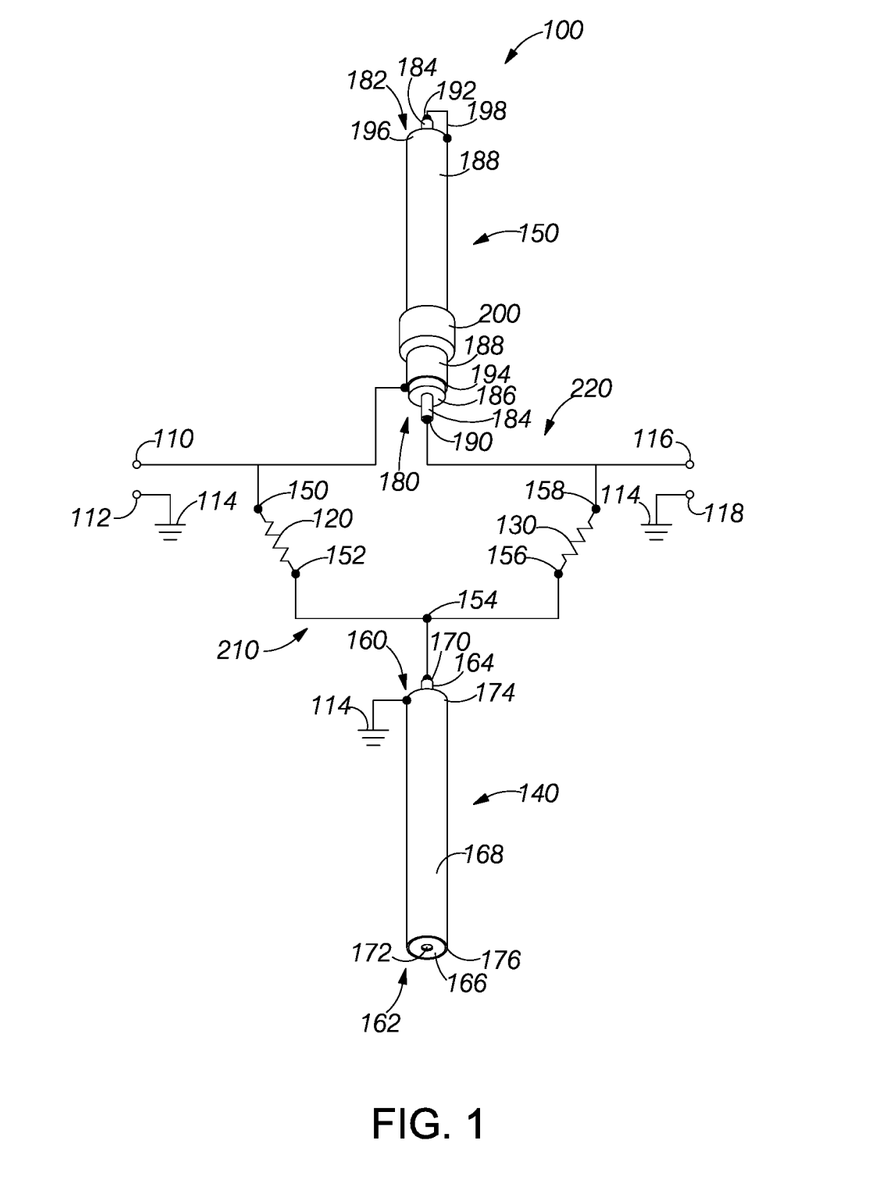
FIG. 1 is a partially pictorial, partially schematic representation of a subcircuit that generates a two-step waveform from a single step input.

FIG. 1 illustrates a partly schematic, partly pictorial representation of a basic two-step subcircuit 100 in accordance with an embodiment disclosed herein. The subcircuit includes a first input terminal 110 and a second input terminal 112. The second input terminal is connected to a ground reference 114. The first input terminal receives a step function signal from a source (not shown) having a 50-ohm output impedance. Signal sources that produce step functions from outputs having 50-ohm output impedances are conventional and are not shown in FIG. 1. The subcircuit further includes a first output terminal 116 and a second output terminal 118. The second output terminal is connected to the ground reference. The first output terminal is connected to a load (not shown) having an impedance of 50 ohms with respect to the ground reference.

The subcircuit 100 includes a first resistor 120, a second resistor 130, a first transmission line 140 and a second transmission line 150. In the illustrated embodiment, each of the first resistor and the second resistor has a respective resistance of 50 ohms; and each of the first transmission line and the second transmission line has a characteristic impedance of 50 ohms.

The first resistor 120 has a first terminal 150 and a second terminal 152. The first terminal of the first resistor is connected to the first input terminal 110 of the subcircuit 100. The second terminal of the first resistor is connected to a node 154. The second resistor has a first terminal 156 and a second terminal 158. The first terminal of the second resistor is connected to the node 154. The second terminal of the second resistor is connected to the first output terminal 116.

The first transmission line 140 has a first end 160 and a second end 162. The first transmission line has a first length between the first end and the second end. In the illustrated embodiment, the first transmission line is a coaxial transmission line having a center conductor 164 surrounded by a dielectric insulator 166. The dielectric insulator is surrounded by an outer shield 168. In the illustrated embodiment, the first transmission line has a characteristic impedance of 50 ohms.

The center conductor 164 of the first transmission line 140 has a first end 170 and a second end 172. The outer shield 168 of the first transmission line has a first end 174 and a second end 176. The first end of the center conductor of the first transmission line is connected to the second terminal 152 of the first resistor 120 and to the first terminal 156 of the second resistor 130 at the node 154. The first end of the outer shield of the first transmission line is connected to the ground reference 114.

The second end 172 of the center conductor 164 of the first transmission line 140 is terminated within the dielectric insulator 166 so that the second end 172 of the center conductor does not extend beyond the second end 176 of the outer shield 168 to inhibit or prevent E-field radiation from the center conductor. The second end of the center conductor of the first transmission line is not connected to the ground reference or to any other circuit element. The second end of the outer shield of the first transmission line is not connected to the ground reference or to any other circuit element. Thus, the second end 162 of the first transmission line is an open circuit. The first transmission line operates as an open circuited transmission stub.

The second transmission line 150 has a first end 180 and a second end 182. The second transmission line has a second length between the first end and the second end. In the illustrated embodiment, the second transmission line is a coaxial transmission line having a center conductor 184 surrounded by a dielectric insulator 186. The dielectric insulator is surrounded by an outer shield 188. In the illustrated embodiment, the second transmission line has a characteristic impedance of 50 ohms.

The center conductor 184 of the second transmission line 150 has a first end 190 and a second end 192. The outer shield 188 of the second transmission line has a first end 194 and a second end 196. The first end of the outer shield of the second transmission line is connected to the first input terminal 110 and to the first terminal 150 of the first resistor 120. The first end of the center conductor of the second transmission line is connected to the second terminal 158 of the second resistor 130 and to the first output terminal 116 of the subcircuit 100.

The second end 192 of the center conductor 184 of the second transmission line 150 is connected to the second end 196 of the outer shield 188 of the second transmission line via a shorting line 198. Thus, the second end 182 of the second transmission line is short circuited. The outer shield of the second transmission line is not connected to the ground reference or to any other circuit element. Thus, the second transmission line is "floating" with respect to the ground reference, and the second transmission line operates as a floating transmission stub.

The second transmission line 150 further includes a ferrite toroid 200. The ferrite toroid has an inner diameter substantially the same as the outer diameter of the second transmission line so that the ferrite fits closely around the second transmission line. The ferrite toroid is positioned on the second transmission line proximate to the first end 180 of the second transmission line. The ferrite toroid blocks high frequency currents from flowing on the outer shield and causing energy loss from the second transmission line.

As shown in FIG. 1, the resistance of the first resistor 120 and the impedance at the first end 160 of the first transmission line 140 are connected in series between the first input terminal 110 and the ground reference 114. Accordingly, the first resistor and the first transmission line comprise a first impedance branch 210 having a first series impedance of 100 ohms between the first input terminal and the ground reference.

The impedance of the floating second transmission line 150 is connected in series with the load impedance connected between the first output terminal 116 and the ground reference 114. As discussed above, both impedances are 50 ohms. Thus, the second transmission line in series with the load comprise a second impedance branch 220 having a second impedance of 100 ohms between the first input terminal and the ground reference.

The effective impedance of the subcircuit 100 at the first input terminal 110 is the combination of the first series impedance (100 ohms) in parallel with the second series impedance (also 100 ohms). Thus, the effective impedance of the subcircuit at the first input terminal is 50 ohms, which matches the impedance of a conventional source (not shown) connected to the first input terminal. Because of the symmetry of the subcircuit, the impedance of the subcircuit at the first output terminal 116 is also 50 ohms. Accordingly, the input impedance and the output impedance of the subcircuit match the impedances of conventional 50-ohm sources and conventional 50-ohm loads.

Each of the first transmission line 140 and the second transmission line 150 has a respective selected length to provide a selected delay for reflections that are produced at the respective second ends 162, 182 of the transmission lines. The one-way delay through a typical 50-ohm coaxial transmission line is approximately 0.2 meters per nanosecond. Thus, a desired delay can be obtained by adjusting the length of the transmission line. For example, a total two-way delay of 10 nanoseconds results when using a transmission line having a length of one meter. In the illustrated embodiment, the length of the first transmission line and the length of the second transmission line are selected to be substantially the same.

When a step function waveform having a maximum input voltage Vin is applied at the first input terminal 110, the input voltage pulse is applied across both impedance branches 210, 220. In the first impedance branch, the input voltage pulse is divided between the resistance of the first resistor 120 and the impedance of the first transmission line 140. Since both impedances are substantially equal, the voltage pulse at the node 154 has an initial amplitude approximately equal to Vin/2. In the second impedance branch, the input voltage pulse is divided between the impedance of the second transmission line 150 and the output impedance at the first output terminal 116. Since both impedances are substantially equal, the voltage pulse on the first output terminal also has an initial amplitude approximately equal to Vin/2. The voltages on each of the first terminal 156 and the second terminal 158 of the second resistor 130 are substantially equal. Thus, substantially no current flows through the second resistor.

In the first impedance branch 210, the voltage pulse with the amplitude Vin/2 initially applied to the first end 160 of the first transmission line 140 propagates to the second end 162 of the first transmission line where the voltage is reflected toward the first end. Since the second end of the first transmission line is an open circuit, the reflected voltage has the same amplitude and same polarity as the incident voltage. Thus, after a two-way time delay determined by the length of the first transmission line, the reflected pulse arrives at the first end of the first transmission line. The amplitudes of the incident voltage pulse and the reflected voltage pulse are added such that the resulting voltage pulse at the node 154 after the two-way delay has an amplitude Vin corresponding to the amplitude of the step function waveform applied to the first input terminal 110.

In the second impedance branch 220, the voltage pulse with the amplitude Vin/2 initially applied to the first end 180 of the second transmission line 150 propagates to the second end 182 of the second transmission line where the voltage is reflected toward the first end. Since the second end of the second transmission line is shorted, the reflected voltage has the opposite polarity as the incident voltage. Thus, after a two-way time delay determined by the length of the second transmission line, the reflected pulse arrives at the first end of the second transmission line. The amplitudes of the incident voltage pulse and the reflected voltage pulse cancel such that the resulting voltage between the outer shield 188 and the center conductor 184 at the first end of the second transmission line is substantially zero after the two-way delay. Since the voltage across the second transmission line is zero, the full amplitude Vin of the input voltage pulse is applied to the first output terminal 116 after the two-way delay.

As described above, the lengths of the first transmission line 140 and the second transmission line 150 are selected to be substantially equal such that after substantially equal two-way delays through the two transmission lines, the full amplitude Vin of the input voltage is applied to the first output terminal 116, to the node 154 and to the first input terminal 110. Accordingly, since the voltage at each end of both resistors 120, 130 are the same, no current flows through either resistor and the amplitude of the voltage at the first output terminal remains stable at Vin.

The second resistor 130 is effectively not a factor in the operation of the subcircuit 100 for generating the rising output waveforms at the first output terminal 116 in response to the step input at the first input terminal 110. The second resistor does absorb energy reflected into the subcircuit from the load connected to the first output terminal. Furthermore, the subcircuit is substantially symmetrical such that a step input signal can be applied to the first output terminal 116 to generate a rising output waveform at the first input terminal 110. In such a circuit, the second resistor 130 operates in manner described above for the first resistor 120. The first transmission line 140 and the second transmission line 150 operate as described above when the first input terminal and the first output terminal are interchanged.

Figure 2:
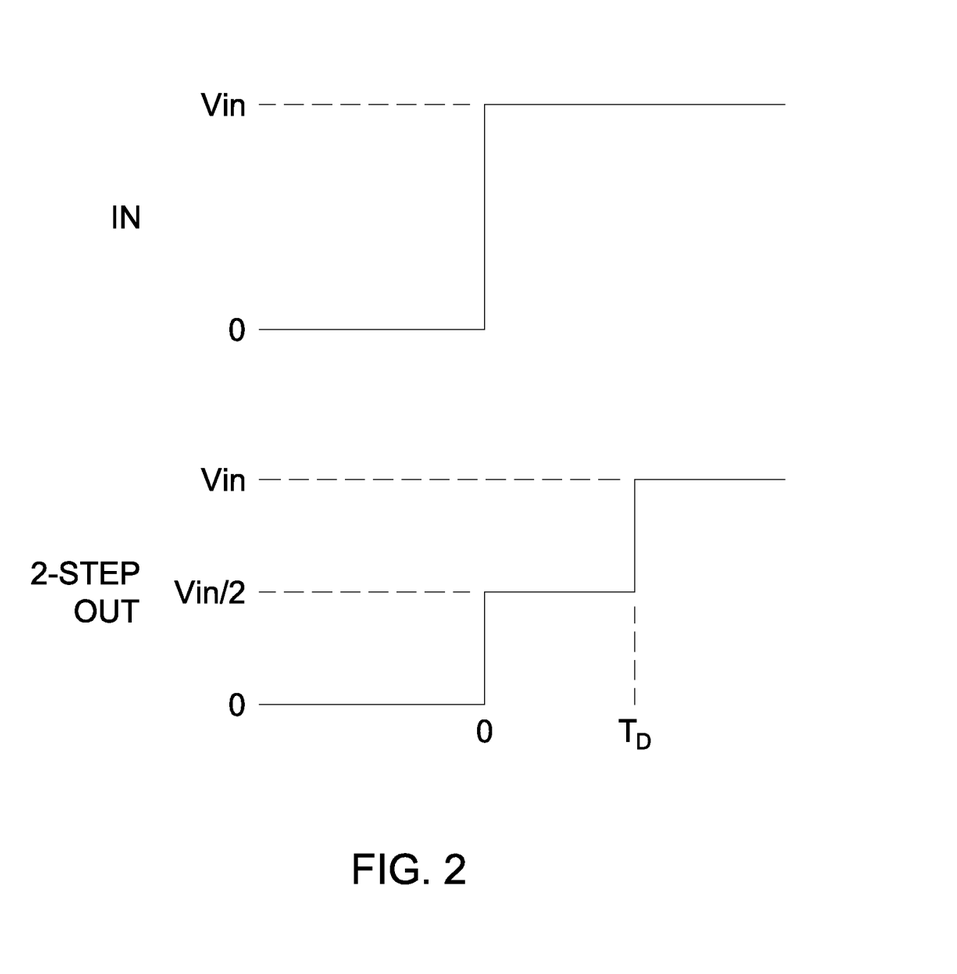
FIG. 2 illustrates timing diagrams showing the relationship between a single step input waveform and a two-step output waveform generated by the subcircuit of FIG. 1.

The forgoing description is illustrated in FIG. 2 by an input step function (IN) illustrated as a first waveform in the top row of a timing diagram. The input step function switches from 0 volts to an amplitude of Vin at a time 0 and remains at that amplitude until removed. As shown by an output signal (2-STEP OUT waveform) in the second row of FIG. 2, the output signal first switches from 0 volts to an amplitude of Vin/2 at the time 0. The output signal remains at the amplitude of Vin/2 for a duration of $T_D$, where $T_D$ is the total two-way (round trip) delay through the selected lengths of the two transmission lines 140, 150. At the time $T_D$, the output signal switches to the full amplitude of Vin and remains at the amplitude Vin for the duration of the input pulse.

Figure 3:
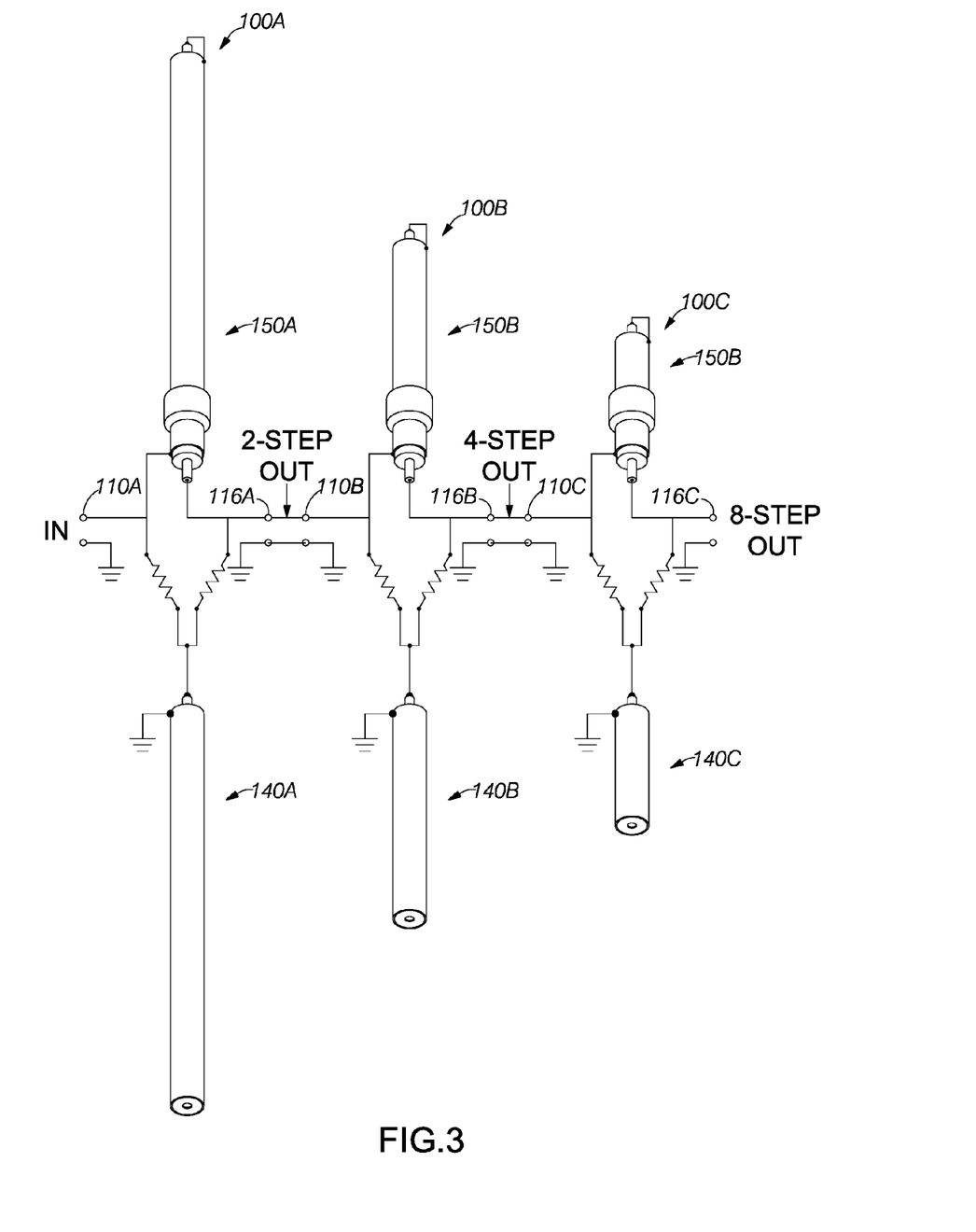
FIG. 3 illustrates three of the subcircuits of FIG. 1 combined to produce an eight-step output ramp from a single-step input.

A plurality of subcircuits 100 are connectable in series as shown in FIG. 3 for a first subcircuit 100A, a second subcircuit 100B and a third subcircuit 100C. In FIG. 3, the respective first transmission line 140, the respective second transmission 150, the respective first input terminal 110 and the respective first output terminal 116 are each labeled with the corresponding suffix (A, B or C) as the respective subcircuit.

Figure 4:
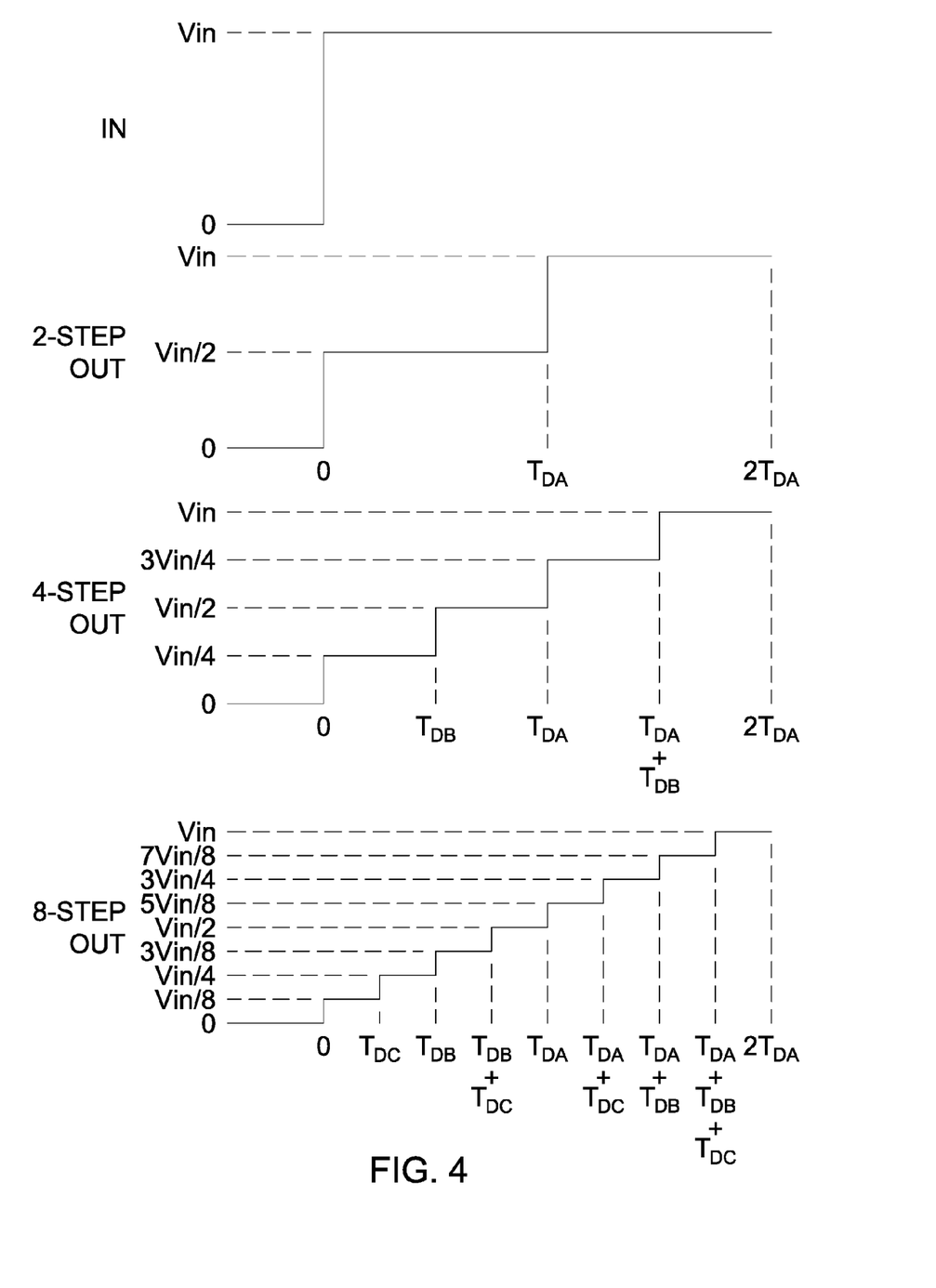
FIG. 4 illustrates timing diagrams showing the relationship between the single-step input, a two-step output, a four-step output and an eight-step output.

The respective first input terminal 110A of the first subcircuit 100A is connectable to a source (not shown) of an input step function (IN) shown as a first waveform in the topmost timing diagram of FIG. 4. The first subcircuit produces a first output signal (2-STEP OUT) on the respective first output terminal 116A. The 2-STEP OUT signal waveform is shown in the second timing diagram of FIG. 4. The input step function (IN) waveform and the 2-STEP OUT signal waveforms in FIG. 4 correspond to the like-identified waveforms in FIG. 2. In particular, the 2-STEP OUT signal waveform initially switches from 0 volts to Vin/2 volts in response to the switching of the input step function switching from 0 volts to Vin volts. The 2-STEP OUT signal switches from Vin/2 volts to Vin volts after a time delay of $T_{DA}$, where $T_{DA}$ is the two-way time delay through each of a first transmission line 140A and a second transmission line 150A in the first subcircuit.

The first output terminal 116A of the first subcircuit 100A is connected to the respective first input terminal 1106 of the second subcircuit 100B such that the second subcircuit receives the 2-STEP OUT signal of the first subcircuit as a respective input signal. The second subcircuit is responsive to each rising step of the respective input signal to produce two output steps on a respective first output terminal 116B for each rising step of the input as illustrated by a 4-STEP OUT signal waveform in the third timing diagram of FIG. 4. The voltage transition for each output step of the 4-STEP OUT signal is approximately one-half the voltage transition for each step of the 2-STEP OUT signal. Thus, when the 2-STEP OUT signal switches from 0 volts to Vin/2 volts, the 4-STEP OUT signal initially transitions from 0 volts to Vin/4 volts. After a time delay of $T_{DB}$, the 4-STEP OUT signal switches from Vin/4 volts to Vin/2 volts to match the voltage on the 2-STEP OUT signal. When the 2-STEP OUT signal switches from Vin/2 volts to Vin volts at the time $T_{DA}$, the 4-STEP OUT signal initially switches from Vin/2 volts to 3Vin/4 volts. Then, after a further delay of $T_{DB}$, the 4-STEP OUT signal switches to Vin volts. Note that the time delays $T_{DB}$ in the second subcircuit are relative to the switching transitions in the 2-STEP OUT signal on the first input terminal of the second subcircuit. In the illustrated embodiment, the lengths of the respective first transmission line 140B and the respective second transmission line 150B of the second subcircuit are selected to be approximately one-half the lengths of the first transmission line 140A and the second transmission line 150A of the first subcircuit.

The first output terminal 116B of the second subcircuit 100B is connected to the respective first respective first input terminal 110C of the third subcircuit 100C such that the third subcircuit receives the 4-STEP OUT signal of the second subcircuit as a respective input signal. The third subcircuit is responsive to each rising step of the respective input signal to produce two output steps on the respective first output terminal 116B for each rising step of the input signal as illustrated by an 8-STEP OUT signal waveform in the fourth timing diagram of FIG. 4. The voltage transition for each output step of the 8-STEP OUT signal is approximately one-half the voltage transition for each step of the 4-STEP OUT signal. Thus, when the 4-STEP OUT signal switches from 0 volts to Vin/4 volts, the 8-STEP OUT signal initially transitions from 0 volts to Vin/8 volts. After a time delay of $T_{DC}$, the 8-STEP OUT signal switches from Vin/8 volts to Vin/4 volts to match the voltage on the 4-STEP OUT signal. When the 4-STEP OUT signal switches from Vin/4 volts to Vin/2 volts, the 8-STEP OUT signal initially switches from Vin/4 volts to 3Vin/8 volts. Then, after a further delay of $T_{DC}$, the 8-STEP OUT signal switches to from 3Vin/8 volts to Vin/2 volts. When the 4-STEP OUT signal switches from Vin/2 volts to 3Vin/4 volts, the 8-STEP OUT signal initially switches from Vin/2 volts to 5Vin/8 volts. Then, after a further delay of $T_{DC}$, the 8-STEP OUT signal switches from 5Vin/8 volts to 3Vin/4 volts. When the 4-STEP OUT signal switches from 3Vin/4 volts to Vin volts, the 8-STEP OUT signal initially switches from 3Vin/4 volts to 7Vin/8 volts. Then, after a further delay of $T_{DC}$, the 8-STEP OUT signal switches to from 7Vin/8 volts to Vin volts. Again, note that the time delays in the third subcircuit are relative to the switching transitions in the 4-STEP OUT signal on the first input terminal of the third subcircuit. In the illustrated embodiment, the lengths of the respective first transmission line 140C and the respective second transmission line 150C of the third subcircuit are selected to be approximately one-half the lengths of the first transmission line 140B and the second transmission line 150B of the second subcircuit.

As discussed above, the time delays in each of the subcircuits 100A, 100B, 100C are determined by the lengths of the respective first transmission lines 140A, 140B, 140C and second transmission lines 150A, 150B, 150C. For the purposes of illustration, the lengths of the transmission lines in each subsequent subcircuit are selected to be approximately one-half the lengths of the transmission lines in the preceding subcircuit. For example, in one embodiment, the lengths of the first and second transmission lines in the first subcircuit are selected so that the two-way delay $T_{DA}$ is 16 nanoseconds; the lengths of the first and second transmission lines in the second subcircuit are selected so that the two-way delay $T_{DB}$ is 8 nanoseconds; and the lengths of the first and second transmission lines in the third subcircuit are selected so that the two-way delay $T_{DC}$ is 4 nanoseconds. Additional subcircuits can be added in series to provide additional steps by reducing the lengths of the transmission lines in each subsequent additional subcircuit.

Figure 5:
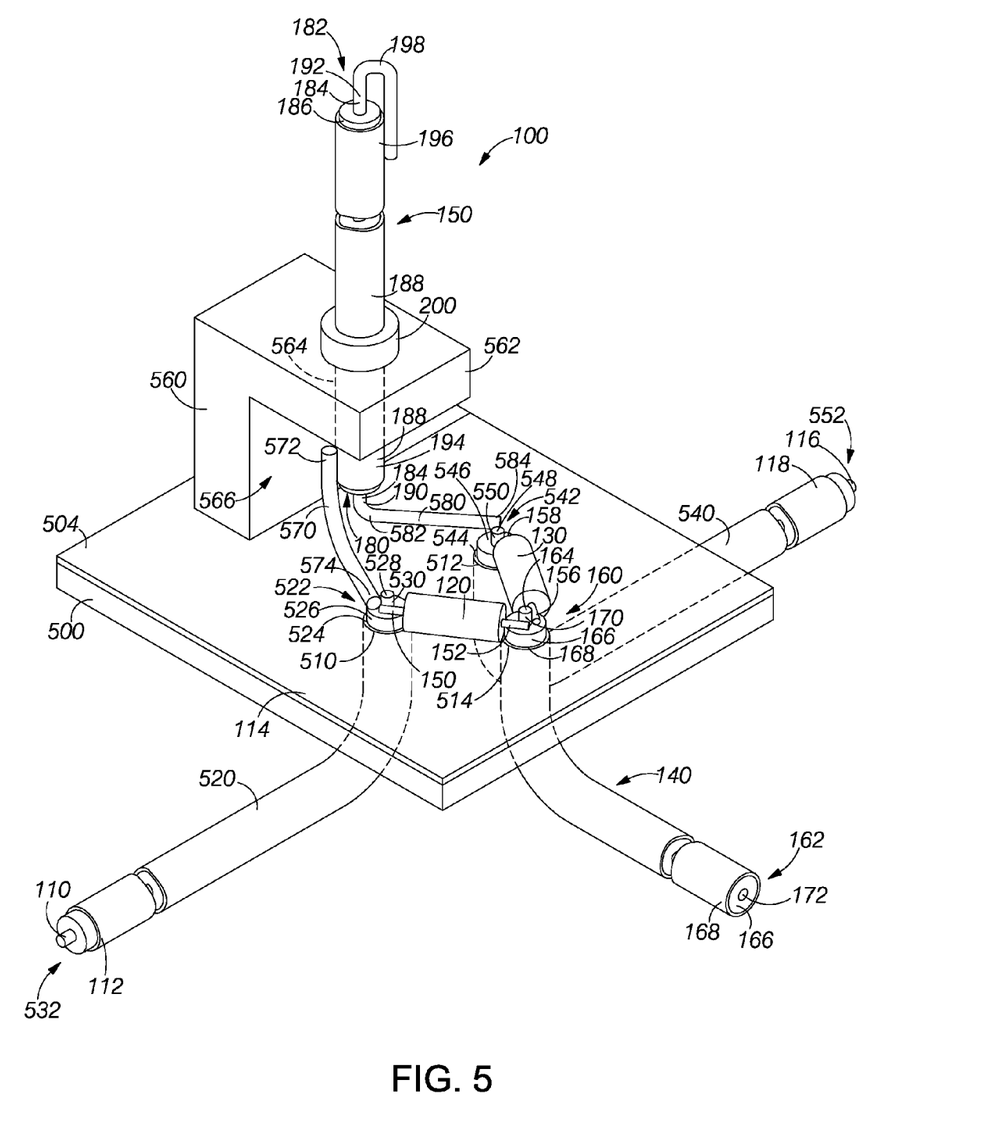
FIG. 5 illustrates a mechanical assembly to implement the subcircuit illustrated schematically in FIG. 1, the subcircuit of FIG. 5 including a coaxial input cable configured to receive an input step voltage and a coaxial output cable that outputs two steps for each input step.

FIG. 5 illustrates an embodiment of a mechanical implementation of the subcircuit 100 on a circuit board 500 comprising an insulated substrate 502 having an upper copper layer 504. The upper copper layer corresponds to the ground reference 114. The circuit board includes a first circular through bore 510, a second circular through bore 512, and a third circular through bore 514 formed through the copper layer and the substrate. The through bores are sized to tightly receive respective the outer shields of respective coaxial cables described below.

An outer shield 524 at a first end 522 of a coaxial input cable 520 is secured in the first through bore 510; and the outer shield is electrically connected to the copper layer (e.g., by soldering or other suitable methods) to ground the outer shield. A short length of dielectric insulator 526 extends above the copper layer, and a short length of a first end 530 of a center conductor 528 extends above the dielectric insulator. The coaxial input cable has a second end 532 which has a second end of the center conductor extending from the dielectric material. As indicated, the second end of the center conductor of the coaxial input cable corresponds to the first input terminal 110 illustrated in FIG. 1 and the center conductor is labeled accordingly in FIG. 5. The outer shield at the second end of the coaxial input cable corresponds to the grounded second input terminal 112 and is labeled accordingly in FIG. 5. The second end of the coaxial input cable is connectable to a signal source (not shown). The length of the coaxial input cable is selectable as needed. The second end of the coaxial input cable can be terminated with a suitable connector in accordance with the requirements of the signal source.

An outer shield 544 at a first end 542 of a coaxial output cable 540 is secured in the second through bore 512; and the outer shield is electrically connected to the copper layer to ground the outer shield. A short length of dielectric insulator 546 extends above the copper layer, and a short length of a first end 550 of a center conductor 548 extends above the dielectric insulator. The coaxial output cable has a second end 552 which has a second end of the center conductor extending from the dielectric material. As indicated, the second end of the center conductor of the coaxial output cable corresponds to the first output terminal 116 illustrated in FIG. 1 and the center conductor is labeled accordingly in FIG. 5. The outer shield at the second end of the coaxial output cable corresponds to the grounded second output terminal 118 and is labeled accordingly in FIG. 5. The second end of the coaxial output cable is connectable to a load (not shown). The length of the coaxial output cable is selectable as needed. The second end of the coaxial output cable can be terminated with a suitable connector in accordance with the requirements of the load.

As discussed above, the coaxial input cable 520 and the coaxial output cable 540 can be interchanged such the input signal is applied to the cable 540 and the output signal is provided by the cable 520.

The third coaxial cable in FIG. 5 corresponds to the first transmission line 140 in FIG. 1 and is labeled accordingly. At the first end 160 of the first transmission line, the outer shield 168 is positioned in the third through bore 514 and is electrically connected to the copper layer, which grounds the outer shield. A short length of the dielectric insulator 166 extends above the copper layer. A short length of the first end 170 of the center conductor 164 extends above the dielectric layer. At the second end 162 of the first transmission line, the outer shield, the dielectric insulator and the center conductor are cut substantially such that the center conductor does not extend beyond the outer shield for the reasons discussed above.

The first end 170 of the center conductor 164 of the first transmission line 140 is electrically connected to the second terminal 152 of the first resistor 120 and to the first terminal 156 of the second resistor 130 as previously described with respect to FIG. 1. The first terminal 150 of the first resistor is connected to the exposed center conductor 528 of the coaxial input cable 520. The second terminal 158 of the second resistor is connected to the exposed center conductor 548 of the coaxial output cable 540.

The second transmission line 150 of FIG. 1 is shown in FIG. 5 mounted in a cylindrical bore 564 of an upper portion 562 of an insulated support structure 560. The insulated support structure is mounted to the upper surface of the circuit board 500 in FIG. 5. The upper portion of the support structure extends over the upper surface of the circuit board to provide an exposed recess 566 between the upper portion and the circuit board. The second transmission line is secured in the cylindrical bore by a suitable fastener (e.g., an adhesive, a clamp, or the like) such that a portion of the second transmission line proximate to the first end 180 of the second transmission line extends into the recess. The second end 182 of the second transmission line extends above the upper portion of the support structure. The ferrite toroid 200 is positioned on the outer shield 188 of the second transmission line and rests on the top of the upper portion of the support structure. The second end 192 of the center conductor 184 of the second transmission line is shorted to the second end 196 of the outer shield by a shorting jumper 198. The shorting jumper may be a separate component, or the shorting component may be an extended portion of the center conductor configured to extend to the outer shield as shown in FIG. 5.

A first jumper wire 570 electrically connects the first end 194 of the outer shield 188 of the second transmission line 150 to the exposed first end 530 of the center conductor 528 of the coaxial input cable 520 and to the first terminal 150 of the first resistor 120. A first end 572 of the first jumper wire may be connected to the outer shield by soldering or other suitable connecting techniques. The opposite (second) end 574 of the first jumper wire may be connected to the center conductor of the coaxial input cable and to the first terminal of the first resistor in like manner.

A second jumper wire 580 electrically connects the first end 190 of the center conductor 184 of the second transmission line 150 to the exposed first end 550 of the center conductor 548 of the coaxial output cable 540 and to the second terminal 158 of the second resistor 130. A first end 582 of the second jumper wire may be connected to the center conductor of the second transmission line by soldering or other suitable connecting techniques. The opposite (second) end 584 of the second jumper wire may be connected to the center conductor of the coaxial output cable and to the second terminal of the second resistor in like manner. In the illustrated embodiment, the second jumper wire is formed as an extended length of the center conductor of the second transmission line and only needs to be connected by soldering or other suitable technique at the second end.

Figure 6:
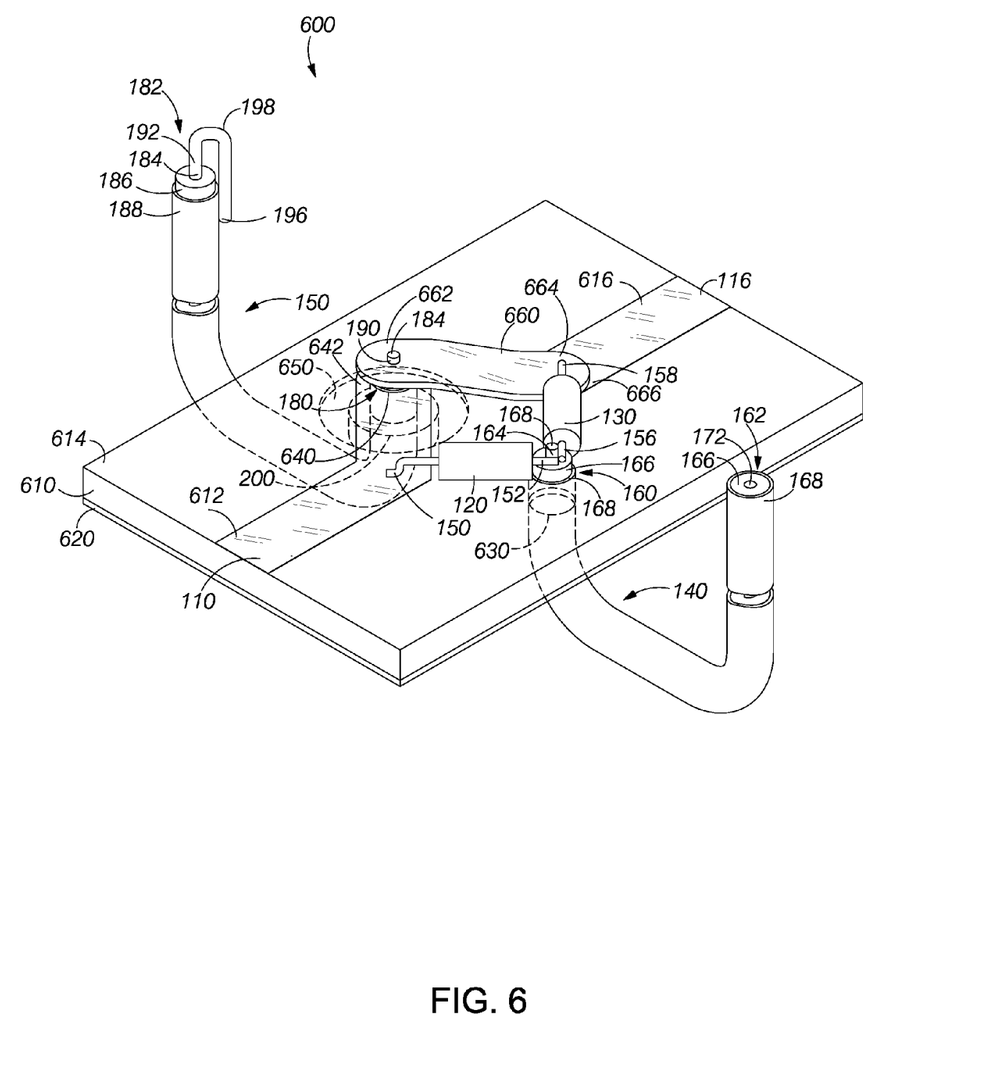
FIG. 6 illustrates a subcircuit similar to the subcircuit of FIG. 5 using traces on a printed circuit board to replace the coaxial input cable and coaxial output cable of the subcircuit of FIG. 5.

FIG. 6 illustrates another embodiment of a subcircuit 600, which operates in similar manner to the subcircuit 100 of FIG. 5. In FIG. 6, the coaxial input cable of FIG. 5 is replaced with a first circuit trace 612 on the upper surface 614 of a printed circuit board 610; and the coaxial output cable of FIG. 5 is replaced with a second circuit trace 616. Accordingly, a first end 110 of the first trace corresponds to the first input terminal shown in FIG. 1; and a first end 116 of the second trace corresponds to the first output terminal of FIG. 1. In FIG. 6, a ground plane 620 is formed on a lower side of the printed circuit board 610.

The first transmission line 140 in FIG. 6 corresponds to the first transmission line in FIG. 1 and in FIG. 5. Like elements of the first transmission line are numbered as before. The first end 160 of the first transmission line extends through a first via (or through bore) 630 that extends from the upper surface 614 of the printed circuit board 610, extends through the printed circuit board, and extends though the ground plane 620. A portion of the dielectric insulator 166 and a portion of the first end 168 of the center conductor 164 of the first transmission line extend substantially vertically upward as shown. The first via is sized so that the outer shield 168 of the first transmission line contacts the ground plane surrounding the first via to electrically connect the outer shield to the ground plane. If needed, the outer shield may be soldered or otherwise secured to the ground plane surrounding the via. The second end 162 of the first transmission line is cut so that the second end 172 of the center conductor, the dielectric insulator and the outer shield are generally even such that the center conductor does not extend beyond the outer shield for the reasons discussed above.

The first end 180 of the second transmission line 150 in FIG. 6 extends through a second via (or through bore) 640. The second via extends through a second end 642 of the first trace 612 and extends through the printed circuit board 610. The second via is sized such that the outer shield 188 of the second transmission line is electrically connected to the first trace surrounding the via. If needed, the outer shield may be soldered or otherwise secured to the portion of the first trace surrounding the via. A circular portion 650 (shown in hidden lines) of the ground plane 620 surrounding the second via is removed to space the ground plane a sufficient distance apart from the outer shield of the second transmission line such that the ground plane has little, if any, effect on any signal propagating on the outer shield. The ferrite toroid 200 (shown in hidden lines) is positioned around the outer shield of the second transmission line as shown for the reasons discussed above. The ferrite toroid may be secured to the second transmission line or to the underside of the printed circuit board by a suitable adhesive.

At the second end 182 of the second transmission line 150, the second end 192 of the center conductor 194 is shorted to the outer shield 188 by the shorting conductor 198, which may be an extended portion of the center conductor, as discussed above.

The first end 190 of the center conductor 184 of the second transmission line 150 is electrically connected to a first end 662 of an interconnection strap 660. A second end 664 of the interconnection strap is electrically connected to a second end 666 of the second trace 616. Accordingly, the first end of the center conductor of the second transmission line is connected to the first output terminal 116 in accordance with the schematic representation in FIG. 1. The first end and second end of the interconnection strap are electrically connected to the other components by soldering or other suitable connection techniques.

The first end 170 of the center conductor 164 of the first transmission line 140 is electrically connected to the second terminal 152 of the first resistor 120 and to the first terminal 156 of the second resistor 130.

The first terminal 150 of the first resistor 120 is electrically connected to the first trace 612. Thus, the first terminal of the first resistor is electrically connected to the first input terminal 110 and to the outer shield 188 of the second transmission line in accordance with the schematic representation in FIG. 1.

The second terminal 158 of the second resistor 130 is connected to the second end 664 of the interconnection strap 660 and is thus connected to the second end 666 of the second trace 616. Thus, the second terminal of the second resistor is electrically connected to the first output terminal 116 and to the first end of the center conductor 184 of the second transmission line 150 in accordance with the schematic representation in FIG. 1.

Figure 7:
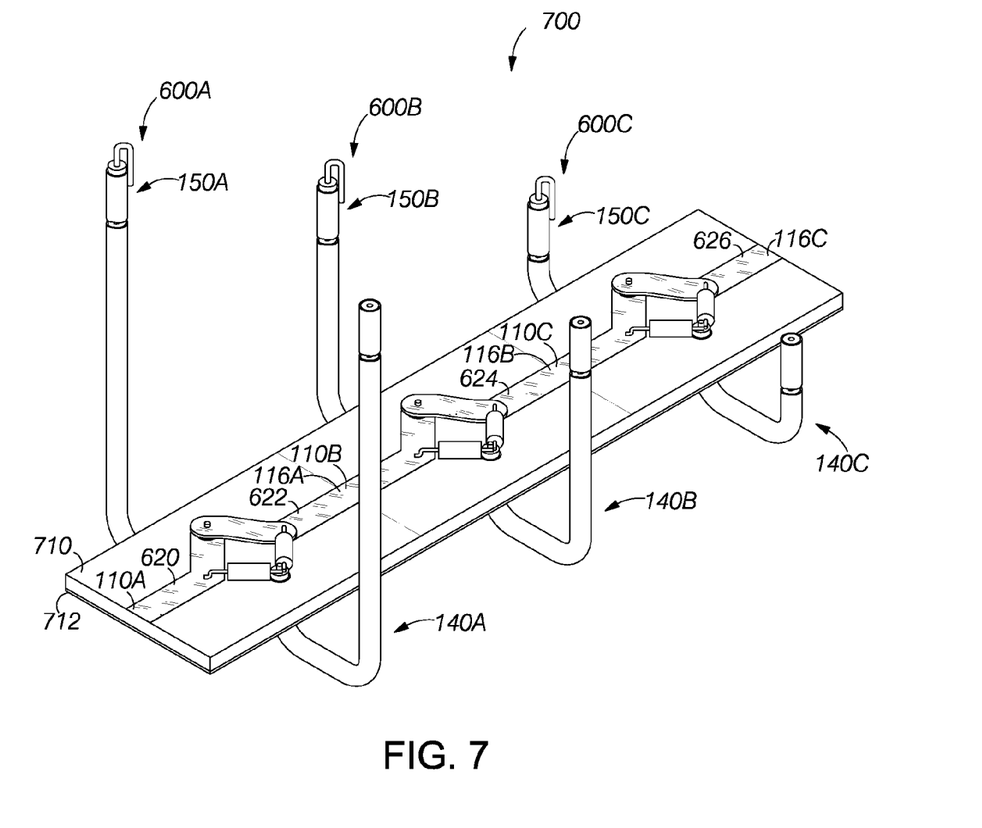
FIG. 7 illustrates a circuit that includes three of the subcircuits of FIG. 6 interconnected to produce a ramp using eight steps.

It should be understood that the printed circuit board 610 in FIG. 6 represents a segment of a printed circuit having a plurality of the subcircuits 600 formed thereon with different lengths of the first transmission line 140 and the second transmission line 150 connected to the other components in each segment. For example, FIG. 7 illustrates a circuit 700 that includes a first subcircuit 600A, a second subcircuit 600B and a third subcircuit 600C interconnected on a single printed circuit board 710 with differing lengths of first transmission lines 140A, 140B, 140C and second transmission lines 150A, 150B, 150C coupled to each subcircuit. The portions of the printed circuit board associated with adjacent subcircuits are delineated with a phantom line; however, it should be understood that the printed circuit board can be a single continuous printed circuit board with a common ground plane 712 on the lower surface.

In the circuit 700 of FIG. 7, the first subcircuit 600A receives a step-input signal on the first input terminal 110A corresponding to an input trace 620. The first output terminal 116A of the first subcircuit is connected to the first input terminal 1106 of the second subcircuit 600B via a first common circuit trace 622. The first output terminal 116B of the second subcircuit is connected to the first input terminal 110C of the third subcircuit 600C by a second common trace 624. The first output terminal 116C of the third circuit corresponds to an output trace 626. Additional subcircuits can be added by connecting subsequent subcircuits to the outputs of prior subcircuits. As illustrated in FIG. 7, the first transmission lines 140A-C and the second transmission lines 150A-C have different lengths to provide decreasing delays in the respective transmission lines. For example, the first and second transmission lines of the second subcircuit are approximately one-half the length of the first and second transmission lines of the first subcircuit; and the first and second transmission lines of the third subcircuit are approximately one-half the length of the first and second transmission lines of the second subcircuit. The lengths of the transmission lines are not drawn to scale in FIG. 7.

The circuit 700 of FIG. 7 produces the 8-step output waveform of FIG. 4 on the first output terminal 116C of the third subcircuit 600C when the single step input waveform of FIG. 4 is applied to the first input terminal 110A of the first subcircuit 600A. Accordingly, the circuit of FIG. 7 corresponds to the circuit of FIG. 3.

Figure 8:
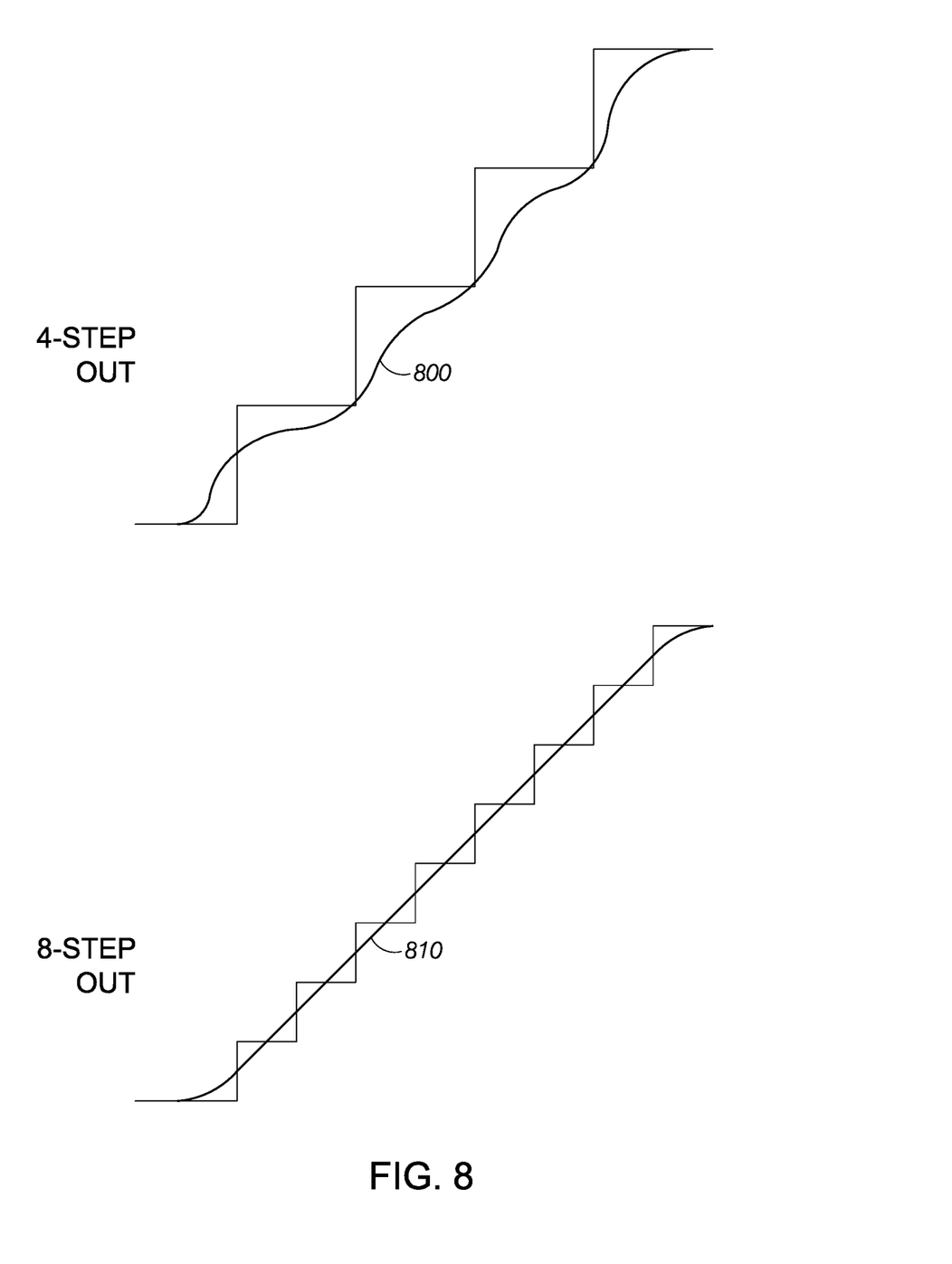
FIG. 8 illustrates the effect of including additional subcircuits to improve the quality of the ramp waveform wherein an upper waveform illustrates the discernible ripple when a four-step circuit generates the ramp; and a lower waveform illustrates the smoother ramp generated from by an eight-step circuit.

FIG. 8 illustrates the effect of including additional subcircuits to improve the quality of the ramp waveform. As illustrated by a first waveform 800, a ramp waveform produced by a four-step waveform using two subcircuits has a discernible ripple. In contrast, adding a third subcircuit to produce an eight-step waveform 810 smooths the ramp to an acceptable amount of ripple. Any smooth ramp waveform will have at least a small amount of rounding at the beginning and end of the ramp. Increasing the number of subcircuits to increase the number of steps reduces the rounding by a factor of two.

Figure 9:
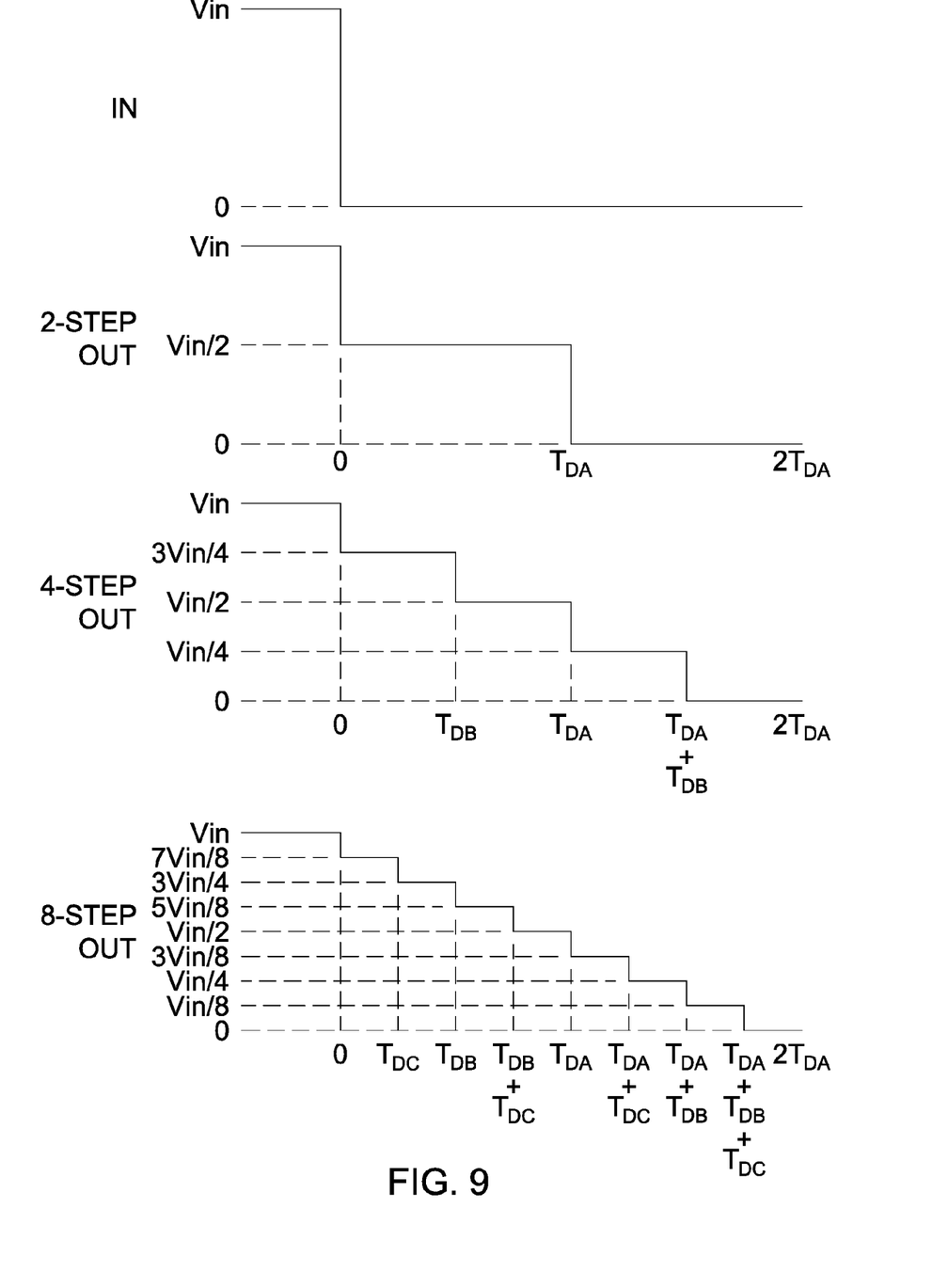
FIG. 9 illustrates timing diagrams showing the relationship between the single-step input, a two-step output, a four-step output and an eight-step output for a single-step input that switches from a high input voltage to zero volts.

As shown in an upper waveform (IN) and a 2-STEP OUT waveform in FIG. 9, the circuits in FIGS. 1 and 3 generate a falling ramp waveform in response to the input waveform on the first input terminal switching from a high input value (Vin) to a low input value (0 volts) in a similar manner. When the input step function is removed, the input voltage drops from Vin to zero. The charges stored in first transmission line 140 and the second transmission line 150 cause current to flow from the transmission lines to the first output terminal 116. Initially, the voltage at the first end 170 of the center conductor 164 of the first transmission line is Vin because of the stored charge present just prior to the dropping of the input voltage. Because of the voltage divider of the second resistor 130 and the load impedance, the output voltage at the first output terminal is initially Vin/2. This initial voltage causes an initial voltage pulse of Vin/2 at the first end 190 of the center conductor 184 of the second transmission line 150. The voltage pulse travels the length of the second transmission line and returns as a pulse of opposite polarity after a two-way delay of $T_D$. The returning pulse offsets the initial voltage and causes the voltage between the center conductor and the outer shield to drop to 0 volts. Since the outer shield is grounded by the low input voltage on the first input terminal, the voltage on the center conductor and thus the voltage on the first output terminal drop to zero at the end of the two-way delay $T_D$.

As further shown by a 4-STEP OUT waveform and an 8-STEP OUT waveform in FIG. 9, combining three subcircuits 100A, 100B and 100C in series produces decreasing ramp waveforms similar to the corresponding to the increasing ramp waveforms of FIG. 4.

The above-described stair-step and ramp circuits can be constructed to match other input and output impedances by using coaxial transmission lines of the required impedance and resistors having resistance values corresponding to the impedance values of the transmission lines. Non-standard impedance values can be obtained by combining transmission lines in parallel. For example, 25-ohm impedance circuits can be produced by using two 50-ohm transmission lines connected in parallel. Similarly, 16.7-ohm circuits can be produced by using three 50-ohm transmission lines connected in parallel.

As various changes could be made in the above constructions without departing from the scope of the invention, it is intended that all the matter contained in the above description or shown in the accompanying drawings shall be interpreted as illustrative and not in a limiting sense.

What is claimed is:

1. An apparatus for generating a multi-step output signal from a single-step input signal, the apparatus comprising:
    a first transmission line, the first transmission line having a first selected length between a respective first end and a respective second end, the first selected length providing a first propagation delay from the first end to the second end and back to the first end, the first transmission line having a respective inner conductor and a respective outer shield and having a first predetermined characteristic impedance, the inner conductor and the outer shield forming an open circuit at the second end of the first transmission line, the outer shield of the first transmission line connected to a voltage reference near the first end of the first transmission line;
    a second transmission line, the second transmission line having a second selected length between a respective first end and a respective second end, the second selected length providing a second propagation delay from the first end to the second end and back to the first end, the second selected length selected such that the second propagation delay is substantially equal to the first propagation delay, the second transmission line having a respective inner conductor and a respective outer shield and having a second predetermined characteristic impedance, the second characteristic impedance substantially equal to the first characteristic impedance, the inner conductor and the outer shield interconnected at the second end of the second transmission line to form a short circuit;
    an input terminal that receives an input signal, the input terminal electrically connected to the outer shield of the second transmission line at the first end of the second transmission line;
    a first resistor having a first terminal electrically connected to the input terminal and having a second terminal electrically connected to the inner conductor of the first transmission line at the first end of the first transmission line, the first resistor having a resistance value substantially equal to the characteristic impedance of the first transmission line;
    an output terminal electrically connected to the inner conductor of the second transmission line at the first end of the second transmission line, the output terminal providing a multi-step output signal in response to the single-step input signal; and
    a second resistor having a first terminal electrically connected to the inner conductor of the first transmission line and having a second terminal electrically connected to the output terminal, the second resistor having a resistor having a resistance value substantially equal to the characteristic impedance of the first transmission line.

2. The apparatus as defined in claim 1, further including a ferrite toroid positioned on the outer shield of the second transmission line near the first end of the second transmission line.

3. An apparatus for generating a multi-step output signal from a single-step input signal, the apparatus comprising:
    an input terminal, the input terminal connectable to receive an input signal from a source having a characteristic impedance;
    an output terminal, the output terminal connectable to a load having the characteristic impedance;
    a first transmission line and a second transmission line, each of the first and second transmission lines having the characteristic impedance between a respective inner conductor and a respective outer shield, each of the first and second transmission lines having a respective length between respective first ends and respective second ends, the lengths of the two transmission lines substantially equal to provide a propagation delay from the respective first end to the respective second end and back to the respective first end, the outer shield of the first transmission line electrically connected to a voltage reference near the first end of the first transmission line, the inner conductor and the outer shield of the first transmission line open-circuited at the second end of the first transmission line, the inner conductor and the outer shield of the second transmission line electrically connected near the second end of the second transmission line, the outer shield of the second transmission line connected to the input terminal; and
    a first resistor and a second resistor, each of the resistors having a resistance, each resistance selected to correspond to the characteristic impedance, the first resistor connected between the input terminal and the first end of the inner conductor of the first transmission line, the second resistor connected between the first end of the inner conductor of the first transmission line and the output terminal.

4. The apparatus as defined in claim 3, further including a ferrite toroid positioned on the outer shield of the second transmission line near the first end of the second transmission line.

5. A method for generating a multi-step output signal from a single-step input signal, the method comprising:
    coupling an input signal from an input terminal to a first terminal of a first resistor having a resistance value;
    coupling the signal from a second terminal of the first resistor to the first end of the inner conductor of a first transmission line having a characteristic impedance corresponding to the resistance value, the first transmission line having a selected length between a first end and a second end to provide a propagation delay from the first end to the second end and back to the first end, the first transmission line having a respective outer shield, the first end of the outer shield electrically connected to a voltage reference, the inner conductor and the outer shield forming an open circuit at the second end of the first transmission line;
    coupling the input signal from the input terminal to the first end of the outer shield of a second transmission line having the characteristic impedance, the second transmission line having the selected length to provide the propagation delay, the outer shield and the inner conductor of the second transmission line short-circuited at the second end of the second transmission line;

coupling the inner conductor of the second transmission line to an output terminal, wherein:

the first transmission line is responsive to an input step voltage of the input signal to propagate a first pulse having a first polarity at a magnitude of approximately one-half the input step voltage from the first end of the first transmission line to the second end of the first transmission line, the first pulse reflected at the open circuited second end of the first transmission line to return to the first end of first transmission line at the magnitude and at the first polarity to produce a voltage approximately equal to the input step voltage at the first end of the inner conductor after the propagation delay; and the second transmission line is responsive to the input step voltage of the input signal to propagate a second pulse having the first polarity and approximately one-half the input step voltage from the first end of the second transmission line to the second end of the second transmission line, the second pulse reflected at the short circuited second end of the second transmission line to return to the first end of second transmission line at a second polarity and at the first magnitude to produce a voltage approximately equal to zero between the inner conductor and the outer shield of the second transmission line after the propagation delay to thereby cause the magnitude of the input step voltage to be applied to the output terminal after the propagation delay, the second transmission line causing the output terminal to have an output voltage that changes to one-half the input voltage when the input voltage first changes and to have an output voltage approximately equal to the input voltage after the propagation delay.

6. The method as defined in claim 5, further including positioning a ferrite toroid on the outer shield of the second transmission line near the first end of the second transmission line to suppress high frequency currents on the outer shield of the second transmission line.

7. The method as defined in claim 5, wherein the input terminal, the output terminal, the first resistor, the first transmission line and the second transmission line comprise a first circuit, the method further including coupling the output terminal of the first circuit to the input terminal of a second circuit, the second circuit substantially identical to the first circuit but with transmission lines of the second circuit having approximately one-half the propagation delay of the first circuit, the second circuit producing an output signal having two steps for each change of the output voltage of the first circuit to thereby produce four steps for each change of the input signal to the first circuit.

* * * * *